(12) United States Patent
Hattori

(10) Patent No.: US 10,874,017 B2
(45) Date of Patent: Dec. 22, 2020

(54) BOARD UNIT

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Yuuichi Hattori, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/306,961

(22) PCT Filed: Jun. 6, 2017

(86) PCT No.: PCT/JP2017/021001
§ 371 (c)(1),
(2) Date: Dec. 4, 2018

(87) PCT Pub. No.: WO2017/213143
PCT Pub. Date: Dec. 14, 2017

(65) Prior Publication Data
US 2019/0191549 A1 Jun. 20, 2019

(30) Foreign Application Priority Data
Jun. 8, 2016 (JP) ................. 2016-114856

(51) Int. Cl.
*H05K 1/00* (2006.01)
*H05K 1/02* (2006.01)
(Continued)

(52) U.S. Cl.
CPC ......... *H05K 1/0263* (2013.01); *H01R 12/718* (2013.01); *H02G 3/14* (2013.01);
(Continued)

(58) Field of Classification Search
CPC ............ H05K 1/0263; H05K 7/06; H05K 2201/10272; H01R 12/718; H02G 3/14; H02G 3/16
See application file for complete search history.

(56) References Cited

U.S. PATENT DOCUMENTS 6,700,795 B1 * 3/2004 Jones .................. H05K 1/141
307/10.8
7,074,053 B2 * 7/2006 Kawakita .......... H01R 13/6658
174/520
(Continued)

FOREIGN PATENT DOCUMENTS

JP 2006-180686 A 7/2006

OTHER PUBLICATIONS

JP 2006180686A English translation (Year: 2006).*
International Search Report, Application No. PCT/JP2017/021001, dated Jul. 11, 2017.

*Primary Examiner* — Pete T Lee
(74) *Attorney, Agent, or Firm* — Honigman LLP

(57) ABSTRACT

A board unit including: a circuit assembly including a circuit board and a bus bar disposed on one side of the circuit board; a frame-like case that forms a housing space for housing the circuit board, and the bus bar includes: a main body to which the circuit board is joined; a plurality of facing portions that protrude from opposite sides of the main body, and that face a surface of the frame-like case, the facing portions and the frame-like case include a locking structure for interlocking the facing portions and the frame-like case with each other to hold the circuit assembly at the predetermined position in the frame-like case.

5 Claims, 5 Drawing Sheets

(51) Int. Cl.
*H05K 7/06* (2006.01)
*H02G 3/16* (2006.01)
*H02G 3/14* (2006.01)
*H01R 12/71* (2011.01)

(52) U.S. Cl.
CPC ............. *H02G 3/16* (2013.01); *H05K 7/06* (2013.01); *H05K 2201/10272* (2013.01)

(56) References Cited

U.S. PATENT DOCUMENTS

| | | | |
|---|---|---|---|
| 7,095,628 B2* | 8/2006 | Friedrich | H01H 85/2045 174/71 B |
| 8,378,235 B2* | 2/2013 | Matsui | B60R 16/0238 174/541 |
| 2006/0214631 A1 | 9/2006 | Yoon et al. | |

* cited by examiner

BOARD UNIT

CROSS-REFERENCE TO RELATED APPLICATIONS

This application is the U.S. national stage of PCT/JP2017/021001 filed Jun. 6, 2017, which claims priority of Japanese Patent Application No. JP 2016-114856 filed Jun. 8, 2016.

TECHNICAL FIELD

The present disclosure relates to a board unit.

BACKGROUND

JP 2010-166691A discloses a board unit (electrical junction box) in which a circuit assembly is housed in a case, the circuit assembly being fixed to the case with screws, in order to position the circuit assembly relative to the case, and to hold the circuit assembly and the case at a predetermined position.

SUMMARY

A board unit according to the present disclosure is a board unit including a circuit assembly having a circuit board and a bus bar disposed on one side of the circuit board and a frame-like case that forms a housing space for housing the circuit board. The bus bar includes a main portion to which the circuit board is joined, and a plurality of facing portions that protrude from opposite sides of the main portion, and that face a surface of the frame-like case, and the facing portions and the frame-like case include a locking structure for interlocking the facing portions and the frame-like case with each other to hold the circuit assembly at a predetermined position in the frame-like case.

DETAILED DESCRIPTION OF PREFERRED EMBODIMENTS

Technical Problem

Figure 1:
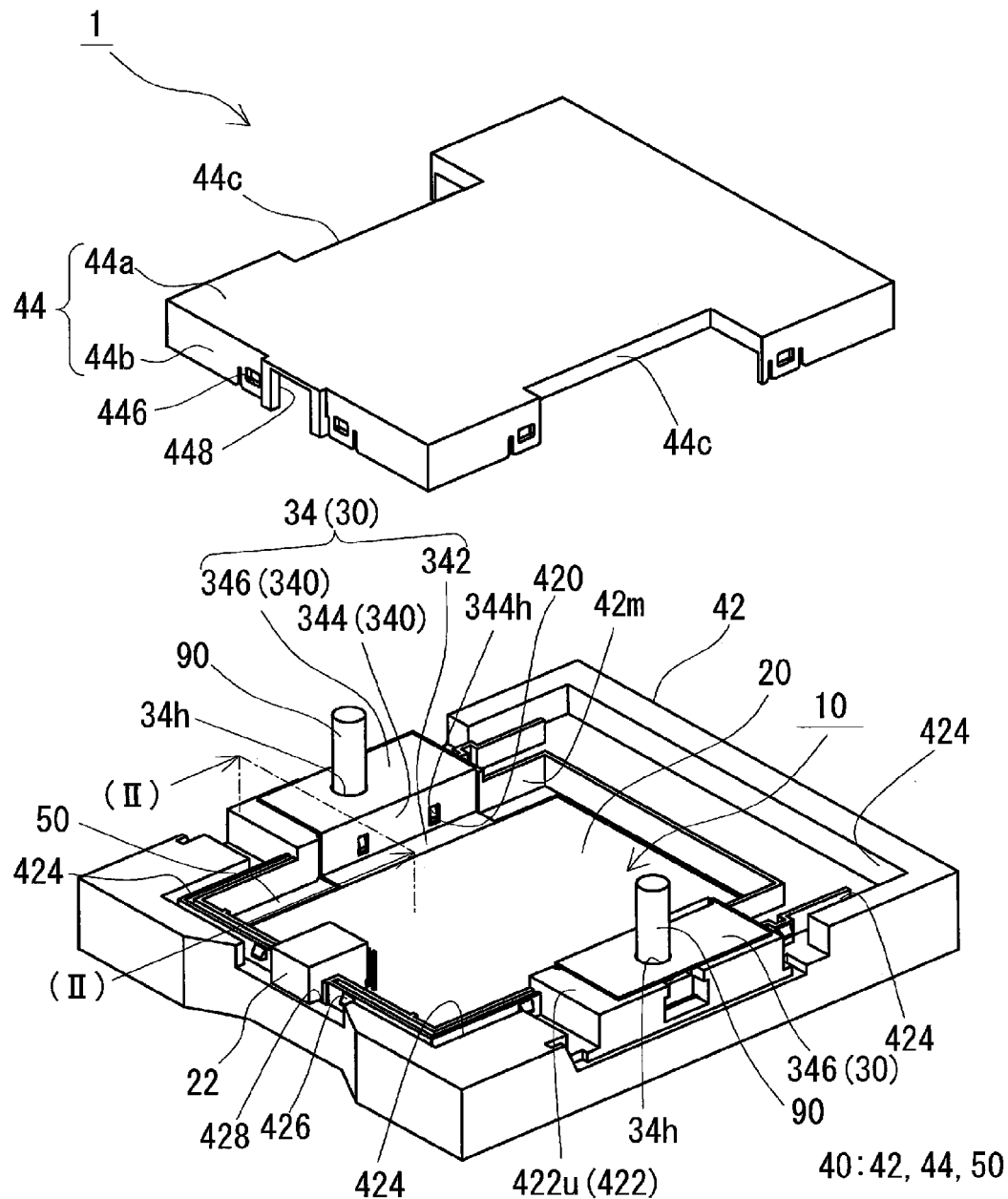
FIG. 1 is a schematic perspective view showing a board unit according to a first embodiment in a state where an upper cover has been removed.

In recent years, there is a desire for improvement in productivity of board units. A circuit assembly and a case can be held at a predetermined position with screws. However, to fasten them with screws, through holes provided in both the circuit assembly and the case are positioned, and then screws are screwed into the through holes. Accordingly, the task of fastening with screws at multiple positions tends to be complicated. It is expected that simplifying the task of fixing the circuit assembly to the case will improve productivity of a board unit.

In view of this, an object of the present disclosure is to provide a board unit in which a circuit assembly can be readily held at a predetermined position relative to a case and which is excellent in productivity.

Advantageous Effects of Disclosure

According to the present disclosure, it is possible to provide a board unit in which a circuit assembly can be readily held at a predetermined position relative to a case and which is excellent in productivity.

Description of Embodiments of Disclosure

First, embodiments of the present disclosure will be listed and described below.

A board unit according to an embodiment of the present disclosure is a boarding unit including a circuit assembly including a circuit board and a bus bar disposed on one side of the circuit board. A frame-like case that forms a housing space for housing the circuit board, and the bus bar includes: a main portion to which the circuit board is joined, a plurality of facing portions that protrude from opposite sides of the main portion, and that face a surface of the frame-like case, and the facing portions and the frame-like case include a locking structure for interlocking the facing portions and the frame-like case with each other to hold the circuit assembly at a predetermined position in the frame-like case.

According to the above-described configuration, the facing portions and the frame-like case have a locking structure for interlocking the facing portions and the frame-like case with each other, and thus it is possible to hold the circuit assembly at a predetermined position relative to the frame-like case without using a member (e.g. a screw) other than the circuit assembly and the frame-like case. It is also possible to omit a step of fixing (e.g. step of fastening with screws) the circuit assembly and the frame-like case due to the circuit assembly and the frame-like case being capable of being interlocked with each other simply by assembling the circuit assembly and the frame-like case. Furthermore, the facing portions each extend on two opposite sides of the main portion and are interlocked with the frame-like case, and thus the circuit assembly can be steadily fixed to the frame-like case from the two sides of the main portion. As described thus far, according to the above-described configuration, the circuit assembly is readily held at the predetermined position relative to the frame-like case, and the productivity is excellent. By locking the circuit assembly and the frame-like case, it is possible to prevent the circuit assembly from coming off of the frame-like case as well as misalignment of the circuit assembly respective to the frame-like case, and so on without holding with another member, even if a set of the circuit assembly and the frame-like case is turned upside-down.

In one embodiment of the above-described board unit, the locking structure may include the through holes formed in the facing portions, and the locking protruding pieces that protrude toward the facing portion from the frame-like case and that interlock with the through holes.

The locking structure including the through holes provided in the facing portions and the locking protruding pieces provided on the frame-like case makes it easy to hold the circuit assembly at the predetermined position relative to the frame-like case.

In one embodiment of the above-described board unit, the locking structure may include a locking protruding piece that extends from a surface of the frame-like case along an outer circumferential side surface toward an outer surface of the facing portion.

As the locking structure, the locking protruding piece is provided on the frame-like case, along the outer circumferential side surfaces, extending toward the outer surface of the facing portions. Accordingly, through holes need not be provided in the facing portions, and thus a conducting region in the bus bar can be better ensured compared to a case where the through holes are provided in the facing portions.

In one embodiment of the above-described board unit, the facing portions may be each provided with an upright portion that stands upright on the main portion and faces an inner surface of the frame-like case, and the locking structure may be provided on the upright portions and the inner surface of frame-like case.

The locking structure is provided on the upright portions and the inner surface of the frame-like case, and thus, when the circuit assembly is attached to the frame-like case, the upright portions naturally drop along the inner surface of the frame-like case due to gravity. Accordingly, it is possible to lock the circuit assembly and the frame-like case without applying a heavy load on the bus bar.

Hereinafter, a board unit according to embodiments of the present disclosure will be described with reference to the drawings. In the drawings, like reference signs indicate parts having the same name.

First Embodiment

Board Unit

Hereinafter, a board unit 1 of the first embodiment will be described with reference to FIGS. 1 to 4. As shown in FIG. 1, the board unit 1 includes a circuit assembly 10 and a case 40 that forms a housing space for housing the circuit assembly 10. The circuit assembly 10 is provided with a circuit board 20 and a bus bar 30 that overlays the circuit board 20. The case 40 is constituted of a frame-like case 42, an upper cover 44 for covering an upper opening of the frame-like case 42, and a bottom plate (heat releasing member 50) for closing a lower opening of the frame-like case 42. The bus bar 30 includes a main portion 32 (FIGS. 2 and 3) to which the circuit board 20 is joined, and a plurality of extending portions 34 (FIG. 1) that protrude from opposite sides of the main portion 32. The extending portions 34 each have a facing portion 340 that faces a surface of the frame-like case 42. A main feature of the board unit 1 of the first embodiment is that the facing portion 340 and the frame-like case 42 have a locking structure for interlocking with each other to hold the circuit assembly 10 at a predetermined position in the frame-like case 42. In this example, the facing portion 340 includes an upright portion 344 that stands upright on the main portion 32 and faces the inner surface 42m of the frame-like case 42, and the locking structure includes a through hole 344h formed in the upright portion 344 and a locking protruding piece 420 provided on the frame-like case 42. Hereinafter, the configurations will be described in detail. It should be noted, that the heat releasing member 50 side of the case 40 of the board unit 1 is referred to as the lower side, and the upper cover 44 side is referred to as the upper side in the description below.

Circuit Assembly

Figure 2:
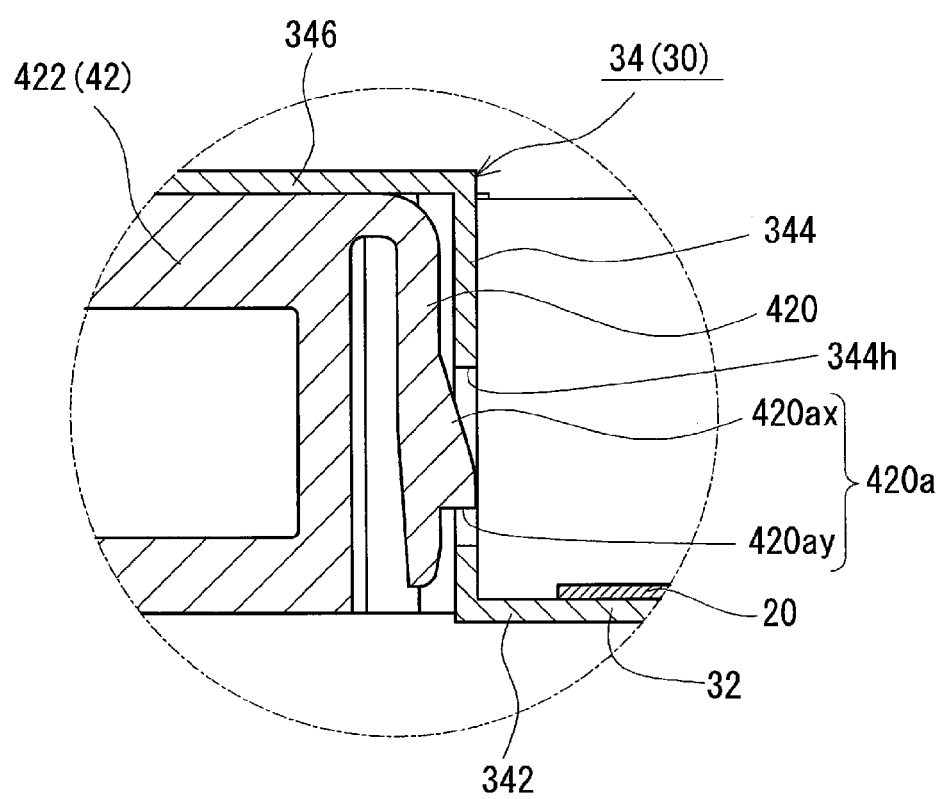
FIG. 2 is a cross-sectional view along (II)-(II) of FIG. 1, showing a state where a locking protruding piece has been inserted into a through hole.
Figure 3:
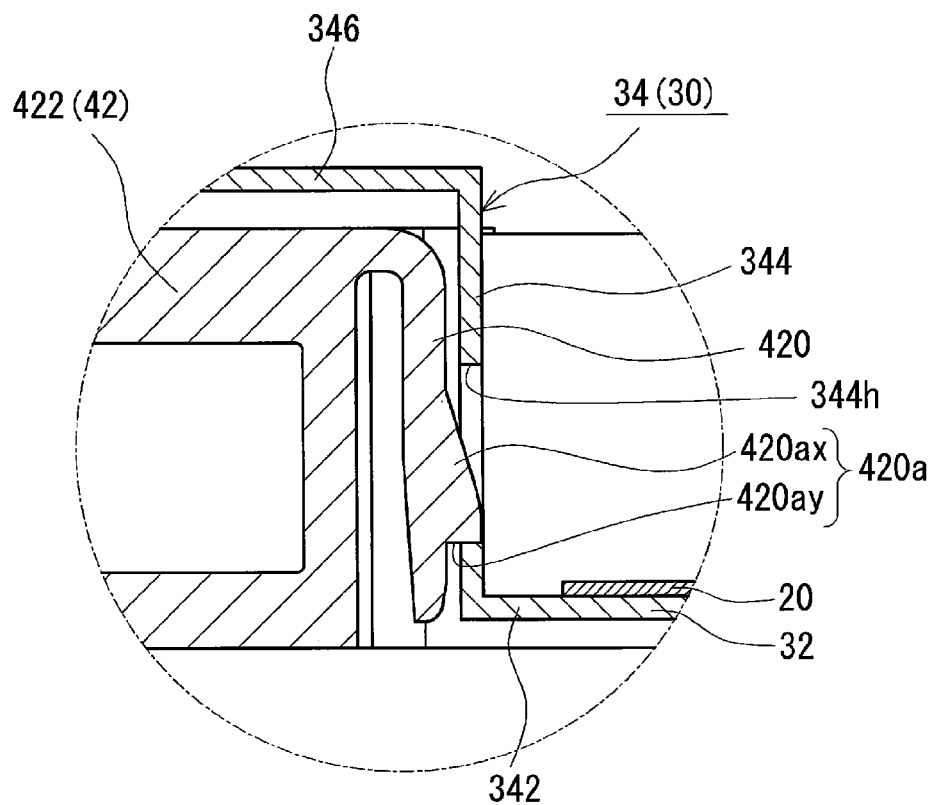
FIG. 3 is a cross-sectional view showing how the locking protruding piece interlocks with the through hole in the board unit according to the first embodiment.

The circuit assembly 10 includes a circuit board 20 and a bus bar 30. As shown in FIGS. 1 to 3, the circuit board 20 is an approximately rectangular printed circuit board arranged on the later-described bus bar 30, and having a conductive pattern (not shown) that is formed on a side opposite to the side on which the bus bar 30 is arranged. A conducting path constituted by the conducting pattern is a control conducting path (a part of a circuit). A connector portion 22 and electronic parts (not shown), such as a switching element, are mounted on the circuit board 20. A mating connector portion of an external control device or the like (not shown) is connected to the connector portion 22.

Bus Bar

As shown in FIGS. 1 to 3, the bus bar 30 includes a main portion 32 (FIGS. 2 and 3) to which the circuit board 20 can be joined, and extending portions 34 (FIG. 1) that are formed with the main portion 32 in one piece and that protrude from the main portion 32. The circuit board 20 can be joined with the main portion 32 of the bus bar 30. Accordingly, the circuit board 20 and the bus bar 30 can be handled as a single component.

The extending portions 34 of the bus bar 30 are portions for electric connection of an external device, and connection terminals (not shown) of a wire (wire harness) are electrically connected to the extending portions 34. Through holes 34h (FIG. 1) for penetration by later-described male screws 90 are formed in the extending portions 34. In this example, the extending portion 34 are provided on two opposed sides of the rectangular main portion 32 of the bus bar 30, and the connection terminals of wires are electrically connected to the extending portions 34. The extending portions 34 may be shifted in the longitudinal direction (a direction orthogonal to both the direction in which the extending portions 34 oppose each other and the thickness direction of the main portion 32) of the circuit board 20, as long as the extending portions 34 are in a state of conduction with the male screws 90.

The extending portion 34 of the bus bar 30 is constituted by a bent piece. Specifically, the extending portion 34 may include a base end portion 342 that extends along the main portion 32 on the main portion 32 side, an upright portion 344 that stands upright on the base end portion 342 (the main portion 32), and a leading end portion 346 that is bent relative to the upright portion 344 and extends outward of the bus bar 30. The base end portion 342 is arranged on a later-described heat releasing member 50, the upright portion 344 is arranged to face an inner surface 42m of a later-described frame-like case 42, and the leading end portion 346 is arranged to face an upper surface 422u of the frame-like case 42 (a base portion 422). In this example, the upright portion 344 and the leading end portion 346 that are arranged to face the surface (the inner surface 42m and the upper surface 422u) of the frame-like case 42 form the facing portion 340. The leading end portion 346 includes a through hole 34h for penetration by the above-described male screw 90. The bus bar 30 and the above-described connection terminal of the wire can be electrically connected by inserting the male screw 90 into the through hole 34h formed in the leading end portion 346, while inserting the male screw 90 into the through hole formed in the connection terminal, and screwing a nut (not shown) onto the male screw 90.

The upright portion 344 includes a plurality of through holes 344h. The through holes 344h penetrate in the thickness direction of the bus bar 30. A feature of the board unit 1 of the first embodiment is that the through holes 344h are constituent elements of the locking structure for holding the circuit assembly 10 at a predetermined position in the frame-like case 42. In the present example, the upright portions 344 each have two through holes 344h. The through holes 344h provided in the upright portions 344 will be described in detail later in the description of the frame-like case 42.

Case

The case 40 includes the frame-like case 42, the upper cover 44, and the heat releasing member 50. The circuit assembly 10 is housed in an inner space formed by assembling the frame-like case 42, the upper cover 44, and the heat releasing member 50.

Frame-Like Case

As shown in FIG. 1, the frame-like case 42 is a rectangular frame that covers the whole outer circumference of the circuit assembly 10 excluding the leading end portions 346 of the bus bar 30. The frame-like case 42 includes base portions 422, which are the parts of the frame part on which the leading end portions 346 of the bus bar 30 are placed. As shown in FIG. 1, the frame-like case 42 is disposed relative to the circuit assembly 10 such that the main portion 32 and the base end portion 342 of the bus bar 30, on which the circuit board 20 is arranged, bridge the opposing frame pieces inside the frame-like case 42, the upright portions 344 of the bus bar 30 face the inner surface 42m of the frame-like case 42, and the leading end portions 346 of the bus bar 30 face the upper surface 422u of the base portion 422 of the frame-like case 42. The inner surface 42m of the frame-like case 42 is provided with locking protruding pieces 420 that interlock with the through holes 344h provided in the upright portions 344 on which the upright portions 344 of the bus bar 30 are arranged. A feature of the board unit 1 of the first embodiment is that the locking protruding pieces 420 are constituent elements of the locking structure for holding the circuit assembly 10 at a predetermined position of the frame-like case 42.

Figure 4:
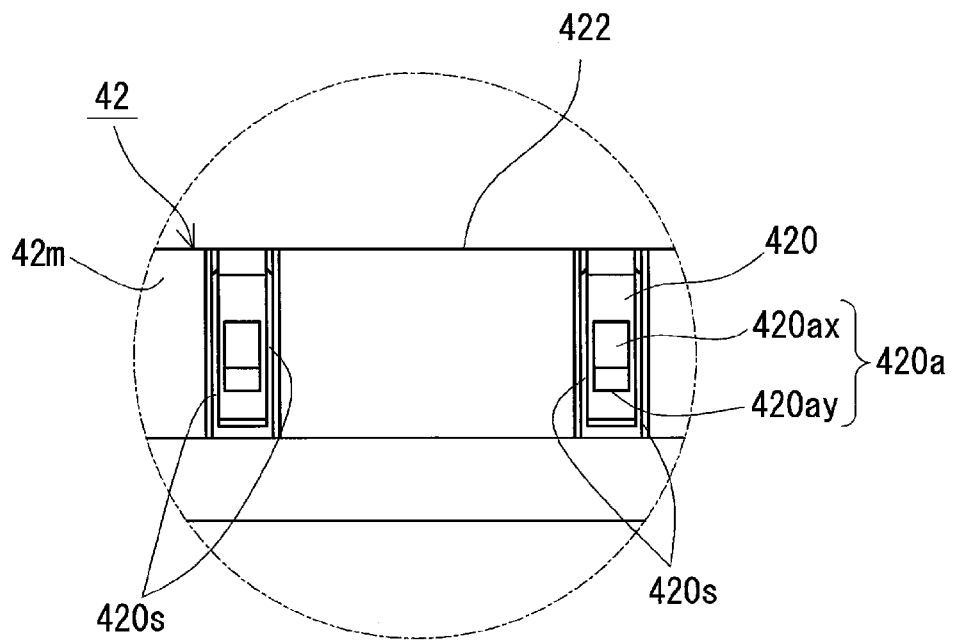
FIG. 4 is a front view of the vicinity of a position where the locking protruding piece is arranged in the board unit according to the first embodiment.

As shown in FIGS. 2 to 4, the locking protruding pieces 420 have a cantilever support structure, in which slits 420s (FIG. 4) are formed in the frame-like case 42 such that the locking protruding pieces 420 can be elastically deformed. Specifically, as shown in FIGS. 2 and 3, the locking protruding piece 420 is a plate-like piece in which one end (the upper side of FIGS. 2 and 3) is a supporting end formed in one piece with the base portion 422 of the frame-like case 42, and another end (the lower side of FIGS. 2 and 3) is an open free end. A locking head portion 420a that protrudes into the frame-like case 42 is provided on the free-end side of the locking protruding piece 420. The locking head portion 420a includes a sloping surface 420ax with which the protruding amount increases from the upper side to the lower side of the frame-like case 42, and a locking surface 420ay capable of interlocking with the inner surface of the through hole 344h below the sloping surface 422ax.

The circuit assembly 10 is entered into the frame-like case 42 from the upper opening, by making the main portion 32 of the bus bar 30 on which the circuit board 20 is arranged face downwards, and inserting the circuit assembly 10 until the leading end portion 346 of the bus bar 30 abuts against the upper surface 422u of the frame-like case 42 (the base portion 422) (see FIG. 2). When the circuit assembly 10 is entered into the frame-like case 42, the sloping surface 420ax of the locking head portion 420a abuts against a surface of the upright portion 344 of the bus bar 30, and enters the through hole 344h of the upright portion 344. At this time, since the locking portion 420 is supported in cantilever manner, while the sloping surface 420ax is abutting against the surface of the upright portion 344, the locking portion 420 is elastically deformed outward (left side of FIGS. 2 and 3) of the frame-like case 42, and when the locking head portion 420a is fully inserted into the through hole 344h, the elastic deformation is recovered to the state before deformation.

In a state where the leading end portion 346 of the bus bar 30 abuts against the upper surface 422u of the frame-like case 42, as shown in FIG. 2, the locking surface 420ay of the locking head portion 420a does not abut against the inner surface of through hole 344h. On the other hand, as shown in FIG. 3, in the state where the locking head portion 420a is inserted into the through hole 344h, if the circuit assembly 10 is lifted from the frame-like case 42 or the set of the circuit assembly 10 and the frame-like case 42 is turned upside-down, the leading end portion 346 of the bus bar 30 moves away from the upper surface 422u of the frame-like case 42. At this time, since the locking surface 420ay of the locking head portion 420a engages the inner surface of the through hole 344h, the circuit assembly 10 can be held at the predetermined position without coming off of the frame-like case 42 regardless whether the bottom plate (heat releasing member 50) is present. The circuit assembly 10 and the frame-like case 42 are fixed temporarily through the locking structure (the through hole 344h and the locking protruding piece 420). When the locking head portion 420a inserted into the through hole 344h is pressed, the locking protruding piece 420 is elastically deformed, and the locking state of the through hole 344h and the locking protruding piece 420 is cancelled.

The shape and number of the locking structures may be selected as appropriate as long as the circuit assembly 10 and the frame-like case 42 are held at the predetermined position. In this example, two locking structures are provided for each of the two upright portions 344 (see FIG. 1). However, one or three or more members of the locking structure can be provided for each of the upright portions 344. It should be noted, that when through holes 344h are formed in the bus bar 30, it is preferable that the position and size of the through holes 344h are selected such that the conductive region is not affected by the through holes 344h. In this example, the cross section of the through holes 344h are rectangular. However, the cross section of the through holes 344h may also be a non-rectangular polygonal or circular shape, as long as the through hole 344h and the locking protruding piece 420 can be interlocked with each other.

Male screws 90 protrude upward from the upper surfaces 422u of the base portions 422. The male screws 90 each include a shaft and a head that is fixed to the base portion 422. In this example, the base portions 422 each include a cutout into which the head of the male screw 90 can be inserted from a side, and a fixing portion for fixing the head in the cutout. The bus bar 30 and an external device can be electrically connected by inserting the shafts of the male screws 90 into through holes 34h formed in the leading end portions 346 of the bus bar 30 and placing the leading end portions 346 on the upper surfaces 422u of the base portions 422, and tightening the leading end portions 346 together with connection terminals (not shown) of a wire using a nut.

The frame-like case 42 includes an insertion groove 424 for insertion of the upper cover 44 on the upper surface excluding the base portion 422, and an engaging portion (engaging protrusion 426) for engaging with the upper cover 44. A side wall portion 44b of the upper cover 44 is inserted into the insertion groove 424. The width of the insertion groove 424 can be selected as appropriate in accordance with the thickness of the side wall portion 44b of the upper cover 44 and the depth of the insertion groove 424 can be selected as appropriate in accordance with the insertion amount of the side wall portion 44b. The engaging protrusion 426 is provided in a suitable position in the circumferential direction of the frame-like case 42, and fixes the upper cover 44 and the frame-like case 42 together in one piece in a state where the side wall portion 44b of the upper cover 44 is inserted into the insertion groove 424.

Heat Releasing Member

The heat releasing member 50 is a member for releasing heat generated from the circuit assembly 10, electronic parts, and so on, to the outside. The heat releasing member 50 serves as a bottom plate for closing the lower opening of the frame-like case 42.

A stepped part (not shown) is formed on the inner edge on the lower opening side of the frame-like case 42, and the heat releasing member 50 is fitted into the stepped part. Through holes (not shown) for penetration by not-shown bolts that are joined with the frame-like case 42 in one piece are formed in the heat releasing member 50. Bolt holes for fixing bolts that are joined with the heat releasing member 50 in one piece are formed in the stepped part of the frame-like case 42. The heat releasing member 50 and the frame-like case 42 can be joined in one piece by fitting the heat releasing member 50 into the stepped part of the frame-like case 42, positioning the through holes of the heat releasing member 50 with respect to the bolt holes of the frame-like case 42 and screwing the bolts thereinto.

Upper Cover

As shown in FIG. 1, the upper cover 44 is a single part constituted of a plate-shaped ceiling portion 44a that covers the upper opening of the frame-like case 42 and forms the upper surface of the case 40, and an approximately rectangular side wall portion 44b that stands upright at a low height from the edge of the ceiling portion 44a. The upper cover 44 can be fixed to and joined with the frame-like case 42 in one piece by inserting the side wall portion 44b into the insertion groove 424 of the frame-like case 42, and engaging the engaging protrusions 426 of the frame-like case 42 with engaging holes 446 provided in the side wall portion 44b.

The upper cover 44 has a form that covers the upper side of the frame-like case 42 while the base portions 422 of the frame-like case 42 are exposed, and includes cutout portions 44c in parts of the outer wall. Due to the cutout portions 44c, gaps through which the leading end portions 346 of the bus bar 30 can be passed are ensured even in a state where the upper cover 44 is fixed to the frame-like case 42. The gaps enable the leading portions 346 of the bus bar 30 to be mounted on the upper surfaces 422u of the base portions 422.

The side wall portion 44b of the upper cover 44 includes an upper recess 448, the frame-like case 42 includes a lower recess 428 at a position corresponding to the upper recess 448, and a connector portion 22 is disposed in the opening formed by the upper recess 448 and the lower recess 428.

Effects

The above-described board unit 1 is provided with a locking structure in which the upright portions 344 include through holes 344h and the inner surfaces 42m of the frame-like case 42 include the locking protruding pieces 420. Accordingly, it is possible to readily lock the circuit assembly 10 and the frame-like case 42 merely by attaching the circuit assembly 10 to the frame-like case 42. Furthermore, the upright portions 344 extend on two opposite sides of the main portion 32 and are interlocked with the frame-like case 42, and thus the circuit assembly 10 can be steadily fixed to the frame-like case 42 at the two opposite sides of the main portion 32. Especially, the locking protruding pieces 420 are elastically deformable and have a cantilever support structure, and thus it is possible to insert the locking protruding pieces 420 into the through holes 344h without applying a heavy load on the bus bar 30 when attaching the circuit assembly 10 to the frame-like case 42.

Since it is possible to lock the circuit assembly 10 and the frame-like case 42 merely by attaching the circuit assembly 10 to the frame-like case 42, no other process for fixing the circuit assembly 10 to the frame-like case 42 needs to be added, and thus the workability is excellent. Furthermore, no other member (e.g. a screw) other than the circuit assembly 10 and the frame-like case 42 needs to be used, and thus the number of parts can be reduced.

Second Embodiment

Figure 5:
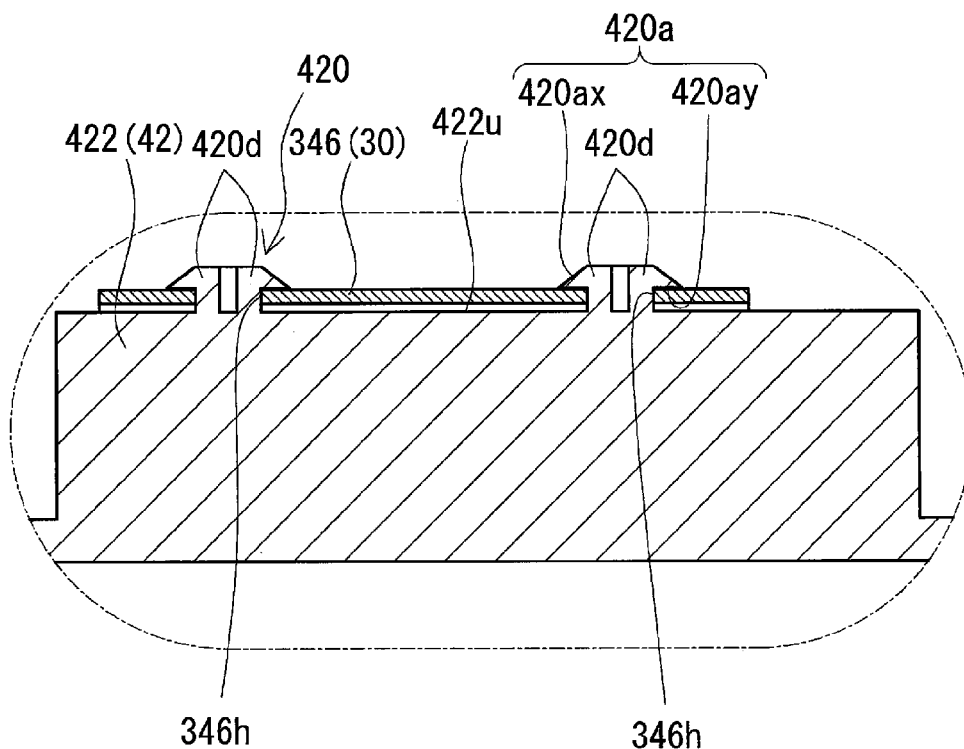
FIG. 5 is a schematic cross-sectional view showing a locking structure of a board unit according to a second embodiment.

In a second embodiment, as shown in FIG. 5, an aspect will be described in which the locking structure includes through holes 346h formed in the leading end portion 346 of the bus bar 30, and locking protruding pieces 420 provided on the upper surface 442u of the frame-like case 42 (base portion 422). FIG. 5 is a schematic cross-sectional view showing a state where the locking protruding pieces 420 interlock with the through holes 346h, viewed from the inside or outside of the frame-like case 42. The second embodiment is different from the first embodiment in that the locking structure is provided on the leading end portions 346 of the bus bar 30 and the upper surfaces 442u of the frame-like case 42 (base portions 422), and the other configuration is similar to the first embodiment.

The through holes 346h are provided in the leading end portions 346 of the bus bar 30 in order to hold the circuit assembly 10 at the predetermined position in the frame-like case 42. In this example, each of the leading end portions 346 has two through holes 346h. The locking protruding pieces 420 that interlock with the through holes 346h in the leading end portion 346 are provided in the upper surface 422u of the base portion 422 of the frame-like case 42. Similarly to the first embodiment, the locking protruding pieces 420 each have a locking head portion 420a projecting outward. The locking head portion 420a includes a sloping surface 420ax that abuts against the edge of the through hole 346h when inserted into the through hole 346h, and a locking surface 420ay that comes in contact with the surface of the leading end portion 346 when the locking head portion 420a is fully inserted into the through hole 346h. The locking protruding piece 420 is constituted of divided protruding pieces 420d obtained by dividing the locking head portion 420a into multiple (here, two) pieces in the circumferential direction. When the divided protruding pieces 420d are assembled, a slit is formed in the middle along the direction in which the locking protruding piece 420 protrudes, such that when the locking head portion 420a is inserted into the through hole 346h, the divided protruding pieces 420d come closer to each other and the diameter of the locking head portion 420a is reduced. When the divided protruding pieces 420d are in the natural state without reducing their diameter, the maximum diameter of the locking head portion 420a is larger than the inner diameter of the through hole 346h.

In this example, there are two divided protruding pieces 420d. However, three or more protruding pieces 420d may be provided. Furthermore, in this example, the divided protruding pieces 420d form a slit that extends over the entire length of the locking protruding piece 420 in the protruding direction. However, it is also possible that only the leading end (the part serving as the locking head portion 420*a*) of the locking protruding piece 420 is divided.

When housing the circuit assembly 10 in the frame-like case 42, the locking head portion 420*a* enters the through hole 346*h* with the sloping surface 420*ax* coming in contact with the edge of the through hole 346*h*. At this time, the divided protruding pieces 420*a* enter the through hole 346*h* while coming closer to each other so as to have a reduced diameter. When the locking head portion 420*a* is fully inserted into the through hole 346*h*, the divided protruding pieces 420*d* revert to the natural state before their diameter is reduced, and the locking surface 420*ay* is interlocked with the edge part of the through hole 346*h*. Accordingly, if the set of the circuit assembly 10 and the frame-like case 42 is turned up-side down, for example, the circuit assembly 10 does not come off of the frame-like case 42 due to the locking surface 420*ay* being in contact with the edge part of the through hole 346*h*, and thus both the circuit assembly 10 and the frame-like case 42 can be held at the predetermined position.

Third Embodiment

Figure 6:
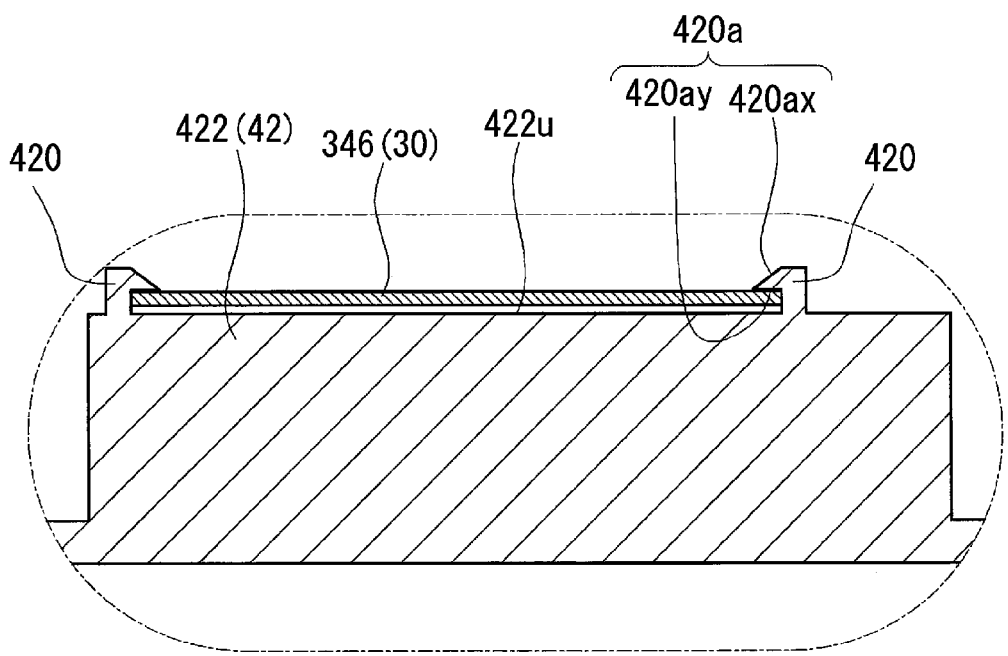
FIG. 6 is a schematic cross-sectional view showing a locking structure of a board unit according to a third embodiment.

In the third embodiment, as shown in FIG. 6, an aspect will be described in which the locking structure includes locking protruding pieces 420 that extend from the surface of the frame-like case 42 (base portion 422) along the outer circumferential side surfaces of the leading end portion 346 toward the outer surface side of the leading end portion 346 of the bus bar 30. FIG. 6 is a schematic cross-sectional view showing a state where the surface edge portions of the leading end portion 346 are interlocked with the locking protruding pieces 420, viewed from the inside or outside of the frame-like case 42. The third embodiment is different from the second embodiment in that the locking structure is provided in the surface edge portions of the leading end portion 346 of the bus bar 30, and the other configuration is similar to the second (first) embodiment.

A pair of locking protruding pieces 420 that protrude upward are provided on the upper surface 422*u* of the base portion 422 of the frame-like case 42. The pair of locking protruding pieces 420 are provided at opposing positions in the direction intersecting the direction in which the extending portion 34 of the leading end portion 346 of the bus bar 30 protrude. The pair of locking protruding pieces 420 are each provided with locking head portions 420*a* that protrude towards each other. The locking head portion 420*a* includes a sloping surface 420*ax* that comes into contact with the edge portion of the leading end portion 346 of the bus bar 30 when the leading end portion 346 is mounted on the upper surface 422*u* of the base portion 422, and a locking surface 420*ay* that comes into contact with the surface edge portion of the bus bar 30 when the leading end portion 346 is held between the pair of locking protruding pieces 420.

Fourth Embodiment

Figure 7:
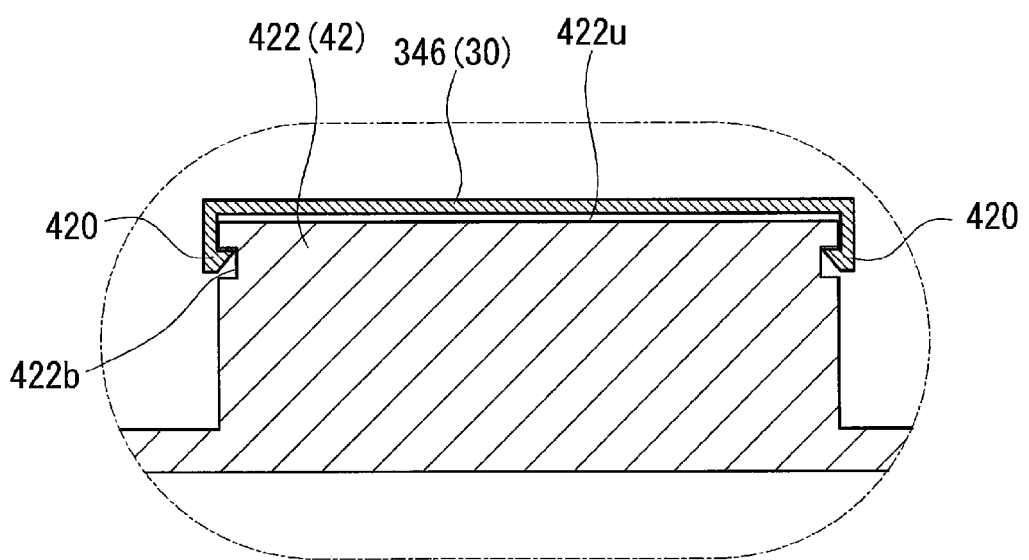
FIG. 7 is a schematic cross-sectional view showing a locking structure of a board unit according to a fourth embodiment.

In the fourth embodiment, as shown in FIG. 7, an aspect will be described in which the locking structure includes locking protruding pieces 420 that protrude downward from the edge portion of the leading end portion 346 of the bus bar 30, and recessed portions 422*b* formed in side walls of the frame-like case 42 (base portion 422) in a direction intersecting the direction in which the extending portion 34 protrudes. FIG. 7 is a schematic cross-sectional view showing a state where the locking protruding pieces 420 interlock with the recessed portions 422*b*, viewed from the inside or outside of the frame-like case 42. The fourth embodiment is different from the second embodiment in that the locking structure includes locking protruding pieces that protrude downward at the side edge portions of the leading end portion 346 of the bus bar 30 and recessed portions 422*b* formed in the base portion 422, and the other configuration is similar to the second (first) embodiment.

The present disclosure is not limited to these examples, and the scope of the present disclosure is defined by the claims, and all modifications equivalent to and within the scope of the claims are intended to be encompassed. For example, the shape, number, position to be formed, and so on of the locking structure may be modified.

The invention claimed is:

1. A board unit comprising:
 a circuit assembly including a circuit board and a bus bar disposed underneath of the circuit board; and
 a frame-like case that forms a housing space for housing the circuit board,
 wherein the bus bar includes:
  a main portion to which the circuit board is joined, and
  a plurality of facing portions that protrude from opposite sides of the main portion so as to be orthogonal to the main portion, and that face a surface of the frame-like case, and
 the facing portions and the frame-like case include a locking structure for interlocking the facing portions and the frame-like case with each other to hold the circuit assembly at a fixed and a predetermined position in the frame-like case so as to prevent the bus bar from being lifted away from the case.

2. The board unit according to claim 1,
 wherein the locking structure includes:
  through holes formed in the facing portions; and
  locking protruding pieces that protrude from the frame-like case to the facing portion side and that interlock with the through holes.

3. The board unit according to claim 1, wherein the locking structure includes a pair of locking protruding pieces spaced apart from each other and wherein each of the pair of locking protruding pieces extending from a surface of the frame-like case the pair of locking protruding pieces spaced apart from each other so as to receive an outer circumferential side surface of the facing portion.

4. The board unit according to claim 1, wherein the facing portions each include an upright portion that stands upright on the main portion and faces an inner surface of the frame-like case, and the locking structure is provided on the upright portion and the inner surface of the frame-like case.

5. The board unit according to claim 2, wherein the facing portions each include an upright portion that stands upright on the main portion and faces an inner surface of the frame-like case, and the locking structure is provided on the upright portion and the inner surface of the frame-like case.

\* \* \* \* \*